United States Patent
Yoshioka et al.

(10) Patent No.: US 6,183,880 B1
(45) Date of Patent: Feb. 6, 2001

(54) COMPOSITE FOIL OF ALUMINUM AND COPPER

(75) Inventors: Junshi Yoshioka; Shinichi Obata; Makoto Dobashi; Takashi Kataoka, all of Saitama (JP)

(73) Assignee: Mitsui Mining & Smelting Co., Ltd., Tokyo (JP)

(*) Notice: Under 35 U.S.C. 154(b), the term of this patent shall be extended for 0 days.

(21) Appl. No.: 09/131,160

(22) Filed: Aug. 7, 1998

(51) Int. Cl.[7] .............................. B21C 37/02; H05K 1/00; C25D 5/10

(52) U.S. Cl. .................. 428/607; 148/264; 148/268; 148/282; 156/247; 156/344; 205/111; 205/112; 205/153; 205/170; 205/177; 205/182; 205/291; 205/293; 205/295; 205/305; 205/309; 361/748; 361/790; 428/637; 428/613; 428/647; 428/652; 428/658; 428/666; 428/674; 428/675; 428/678; 428/680; 428/457; 428/901; 428/926; 428/935; 439/55

(58) Field of Search .......................... 428/607, 637, 428/613, 647, 652, 658, 666, 674, 675, 678, 680, 457, 901, 926, 935; 148/264, 268, 282; 156/247, 344; 361/748, 790; 439/55; 205/111, 112, 153, 170, 177, 182, 291, 293, 295, 305, 309

(56) References Cited

U.S. PATENT DOCUMENTS

| | | | |
|---|---|---|---|
| 3,886,022 | * 5/1975 | Konicek | 156/247 |
| 3,936,548 | 2/1976 | Konicek | 427/405 |
| 3,990,926 | 11/1976 | Konicek | 156/3 |
| 3,998,601 | 12/1976 | Yates et al. | 29/195 |
| 4,088,544 | 5/1978 | Hutkin | 204/12 |
| 4,293,617 | 10/1981 | Nagy | 428/469 |
| 4,357,395 | 11/1982 | Lifshin et al. | 428/607 |
| 5,057,372 | * 10/1991 | Imfeld et al. | 428/901 |
| 5,617,629 | 4/1997 | Ekström | 29/846 |

FOREIGN PATENT DOCUMENTS

| | | |
|---|---|---|
| 0 208 177 A2 | 1/1987 | (EP) . |
| 1458260 | 12/1976 | (GB) . |

* cited by examiner

Primary Examiner—Deborah Jones
Assistant Examiner—Robert R. Koehler
(74) Attorney, Agent, or Firm—Jenkens & Gilchrist

(57) ABSTRACT

This invention provides a composite foil comprising an aluminum carrier layer and an ultra-thin copper foil having a protective layer disposed between them comprising a porous copper layer and an interpenetrating zinc layer. A process for producing such composite foils comprises the steps of preparing the surface of the aluminum carrier, electrodepositing a porous copper layer on the aluminum carrier layer followed by electrodepositing a zinc layer, and then electrodepositing two layers of copper to form the ultra-thin copper foil. The composite foil provides a uniform bond strength between the aluminum carrier and the protective layer which is adequate to prevent separation of the carrier and ultra-thin copper foil during handling and lamination, but which is significantly lower than the peel strength of a copper/substrate bond, so that the carrier can easily be removed after lamination of the composite foil to an insulating substrate. The invention also includes laminates made from such composite foils and printed wiring boards made from such laminates.

26 Claims, 2 Drawing Sheets

(1 of 2 Drawing Sheet(s) Filed in Color)

Discoloration Scale

| Level 1 | Level 2 | Level 3 |
| 100 to 50% discolored | 49 to 2% discolored | 1% or less discolored |

COMPOSITE FOIL OF ALUMINUM AND COPPER

FIELD OF THE INVENTION

The present invention relates generally to making and using ultra-thin copper foil and, more particularly, to a composite foil which facilitates handling of ultra-thin copper foil in the production of printed wiring boards. The invention also relates to a composite foil in which a unique metallic layer is disposed between an aluminum carrier and an ultra-thin copper foil, and the processes of producing and using such a composite foil.

BACKGROUND OF THE INVENTION

As electronic equipment and the associated circuitry become smaller, the pattern widths and spacing of the circuit lines on printed wiring boards have become very narrow. As a result, the copper foil used for making the circuit lines has tended to become thinner, for example, 12 $\mu$m thick foils are used, rather than conventional 35 $\mu$m and 18 $\mu$m foils. Recently, the need for thin copper foil has increased and ultra-thin copper foils have been tried. Handling a copper foil of 12 $\mu$m or less, is however, is difficult. For example, it can wrinkle or tear while being produced and/or handled. Similar problems occur when an ultra-thin copper foil is used as the outer layer of a multi-layer printed wiring board. A method of preventing these problems with handling ultra-thin copper foil is needed.

It has been previously proposed to support ultra-thin copper foils on a metal carrier layer which is separated after the copper foil has been laminated to a substrate. Generally, a release layer is used between the copper foil and the metal carrier. Printed wiring boards can be made from such supported ultra-thin copper foils by depositing a copper layer having a thickness of 1–12 $\mu$m onto a metal carrier layer having a thickness of 18–70 $\mu$m, then applying the exposed surface of the copper layer to a prepreg, such as a glass-reinforced epoxy resin or the like, and laminating by hot pressing. Finally, the metal carrier layer is separated, leaving a copper-clad laminate from which a printed wiring board can be made.

Several carrier metals and types of release layers have been suggested. When aluminum is used as the carrier layer, several types of release layers have been proposed, for example:

1. a release layer of the sulfides or oxides of Cr, Pb, Ni and Ag (for example, in U.S. Pat. No. 3,998,601 and EPO No. 208 177 A);
2. a release layer formed of nickel or nickel alloy plating after an initial zinc plating or zincate treatment (for example, in U.S. Pat. Nos. 3,936,548 and 3,990,926);
3. a release layer of aluminum oxide (for example, in Japanese Patent Application Publication (Examined) No. Sho 60-31915, U.S. Pat. No. 4,293,617, and U.K. Patent No. GB 1,458,260); or
4. a release layer of silica (for example, in U.S. Pat. No. 4,357,395).

Such conventional supported copper foils have, however, been found to present problems.

If the release layer is not uniform over the surface of the carrier layer, bond strength between the carrier layer and the ultra-thin copper foil is uneven. Consequently, when the carrier layer is peeled off after laminating a composite foil, if the bond strength is high, some of the ultra-thin copper foil may remain on the carrier layer and the required circuit pattern cannot be made. If the bond strength is weak, the ultra-thin copper foil may separate from the carrier layer prematurely during production and use of the composite foil.

When oxides, sulfides, chromium or inorganic materials, such as chromium or the like, are used as release layers, some of the inorganic material remains on the surface of the ultra-thin copper foil after the carrier layer is peeled off.

Finally, when the composite foil is laminated to a substrate, such as an epoxy prepreg at high temperatures, it becomes difficult to peel off the carrier layer and it may be necessary to use chemical etching to remove the carrier. The high temperatures used in lamination also tend to cause discoloration of the copper foil by oxidation of the surface.

Because of these problems, composites of ultra-thin copper foil on a carrier layer are not generally used in industry at present, despite the methods just discussed.

Accordingly, the present inventors sought a composite foil which overcomes the problems discussed above and a process for making such composite foils. They investigated the metals and/or metal compounds which have conventionally been suggested as release layers for composite foils in the prior art.

The inventors have found that deposition of copper directly on an aluminum surface, or one covered by aluminum oxide, is unsatisfactory since the bond strength is too weak. Consequently, the ultra-thin copper foil may easily be separated from an aluminum carrier during handling or laminating to insulating substrates.

They have found that when zinc is used as a release layer, as suggested by the earlier art, the bond strength is too great to permit easy removal of an aluminum carrier. Thus, it was necessary to etch away the aluminum, with the undesirable consequences of such procedures. It would be preferable to mechanically separate the aluminum carrier and, thus, avoid etching.

Deposition of zinc on aluminum often has been done by a chemical displacement reaction, referred to as a "zincate process." Zinc ions provided by a zinc compound in solution are contacted with the aluminum carrier. The aluminum surface is dissolved and replaced with zinc metal. It is possible to deposit ample zinc metal in a very short time. Thus, the zincate process is convenient, although not easily controlled. Electrodeposition of zinc is more readily controlled. But even with electrodeposition, the adhesion of zinc to aluminum is too strong to permit easy removal of the aluminum carrier.

In another commonly assigned patent application, the problems associated with the bond strength between an ultra-thin copper foil and a metallic carrier have been overcome by the use of certain organic compounds as a release layer. Below, the present inventors will show how zinc can be used successfully between an ultra-thin copper foil and an aluminum carrier.

SUMMARY OF THE INVENTION

As used in this invention, the term "bond strength" refers to the force required to separate the carrier layer from the ultra-thin copper foil. The term "peel strength" refers to the force required to separate the ultra-thin copper foil from a substrate to which it has been laminated.

A composite foil of the invention comprises an aluminum carrier layer and an ultra-thin copper foil having a zinc-containing protective layer disposed between them. The protective layer consists of a porous layer of copper with interpenetrating zinc. The bond strength is sufficient to permit handling of the composite foil, but low enough to permit easy separation of the aluminum carrier from the ultra-thin copper foil after the latter has been laminated to an insulating substrate. The zinc is believed to provide needed bond strength, but it also provides protection for the ultra-thin copper foil after the aluminum carrier has been removed, thus exposing the copper.

In one embodiment, the protective layer comprises a porous layer of electrodeposited copper of about 500–4000 mg/m$^2$ of said aluminum carrier, preferably about 500–3000 Mg/m$^2$. The interpenetrating zinc is electrodeposited on the porous layer of copper. The amount of zinc deposited is preferably about 15–150 mg/m$^2$ of the aluminum carrier, more preferably about 50–100 mg/m$^2$.

In another embodiment, the invention is a process for producing a composite foil consisting of an ultra-thin copper foil on an aluminum carrier layer which comprises the steps of:

(a) cleansing and removing aluminum oxide from the surface of the aluminum carrier layer;

(b) electrodepositing a porous copper layer on the aluminum carrier after step (a);

(c) electrodepositing zinc on the porous copper layer of (b) to form a layer of porous copper with interpenetrating zinc;

(d) electrodepositing a first layer of copper from a bath which does not remove the zinc deposited in (c); and (e) electrodepositing a second layer of copper sufficient to provide the desired thickness of ultra-thin copper foil.

In subsequent steps, the exposed copper surface of the composite foil may be given additional nodularization and passivation treatments to improve adhesion and to prevent oxidation of the ultra-thin copper foil prior to lamination.

In one aspect, the invention is a composite foil having a porous copper layer with interpenetrating zinc as just described, which is disposed between an aluminum carrier layer, which may also be a foil, and an ultra-thin copper foil.

A copper-clad laminate of the present invention comprises the composite foil according to the invention laminated to an insulating substrate. Alternatively, it comprises the ultra-thin copper foil having an exposed surface protected with zinc and laminated to the insulating substrate and which remains after removing the aluminum carrier layer.

A printed wiring board of the present invention may be made by forming a wiring pattern from the ultra-thin copper foil exposed by separating the aluminum carrier layer from the copper-clad laminate just described.

The file of this patent contains at least one drawing executed in color. Copies of this patent with color drawings will be provided by the Patent and Trademark Office upon request and payment of the necessary fee.

DESCRIPTION OF ILLUSTRATIVE EMBODIMENTS

Figure 1:
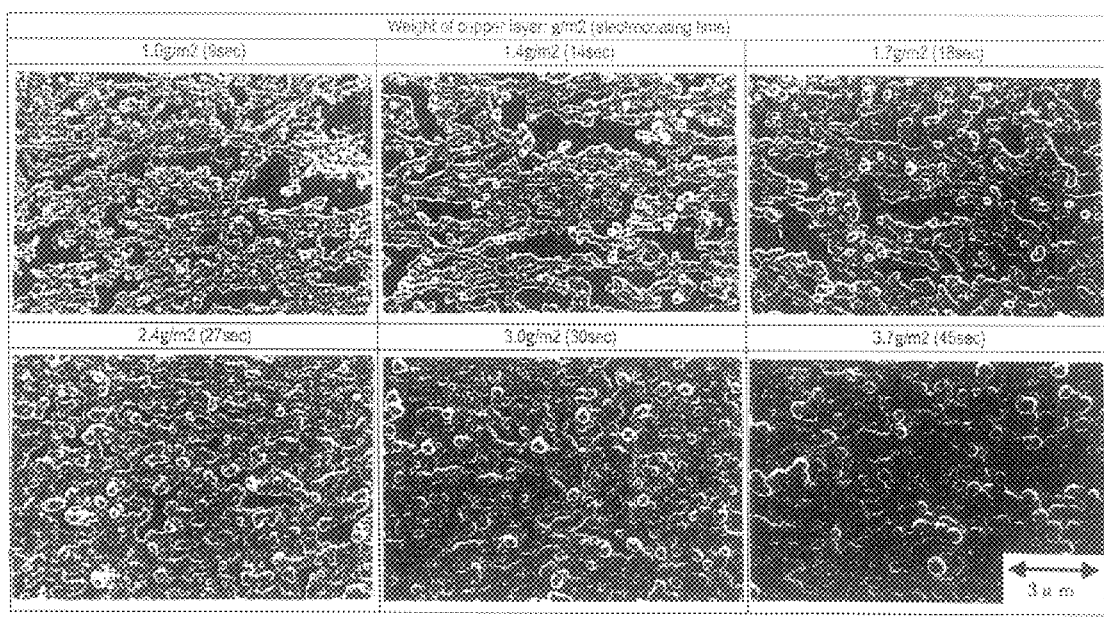
FIG. 1 is a series of photographs illustrating the deposition of various amounts of copper on an aluminum carrier.

In general, the composite foil of the present invention is characterized by having a protective layer of porous copper and interpenetrating zinc between an aluminum carrier layer and an ultra-thin copper foil. In one function, the protective layer serves as a release layer and provides a bond strength between the aluminum carrier and the ultra-thin copper foil sufficient to permit handling and lamination to an insulating substrate, but weak enough to permit separation of the aluminum carrier after lamination. The protective layer also provides oxidation protection to the copper foil surface so that it is not discolored when exposed to high temperatures during lamination.

The thickness of the aluminum carrier layer is not considered to be critical, and it may be a foil from about 18–70 µm thick. Since a typical carrier layer is relatively thin, it will also be referred to as a foil, but it is to be understood that the support layer could be thicker than ordinary foils. For example, heavier carrier sheets up to about 5 mm thick may be used.

The thickness of the ultra-thin copper foil layer to be formed on the protective layer is generally not more than 12 µm thick and may be much thinner, for example, 5–7 µm or less. A copper foil having a thickness of more than 12 µm can be produced by conventional processes, and can be handled without a carrier layer, although the process described herein could be used to deposit copper foils thicker than 12 µm, if desired. The ultra-thin copper foil layer is preferably formed by electrodeposition, although vapor deposition or electroless plating may be employed, provided that the ultra-thin copper layer is suitable for making circuit patterns and has acceptable bond and peel strengths.

As discussed above, the inventors have found that electrodepositing zinc (or using the zincate process) directly on an aluminum carrier, followed by electrodeposition of an ultra-thin copper foil, produces a composite which has a bond strength which is so strong that the aluminum carrier cannot be readily separated after the ultra-thin copper foil has been laminated to an insulating substrate. Thus, the aluminum carrier is typically removed by chemical etching, which is an undesirable method. It is more expensive and involves disposal of caustic solutions. If copper is electrodeposited directly on an aluminum carrier, however, the bond strength is too weak. The present invention provides a method for obtaining suitable bond strength while, at the same time, protecting the ultra-thin copper foil after it is separated from the aluminum carrier.

Where adhesion is measured in accordance with the Japanese standard JIS-C-6481, the range of the bond strengths between the ultra-thin copper foil and the aluminum carrier is about 1–50 gf/cm (gm force/cm width), preferably 1–2 gf/cm, to assure that the carrier layer can be separated from the ultra-thin copper foil after laminating the composite foil on an insulating substrate. This bond strength is relatively low, but it is sufficient to permit handling. It is uniform, and the carrier can easily be removed after the ultra-thin copper foil has been laminated to a substrate. When less than 1 gf/cm, the bond strength is so weak that bulging or separating of the ultra-thin copper foil occurs during lamination with a substrate or during punching or drilling of a laminate or a circuit board. When greater than 50 gf/cm, the bond strength is so large that it is not possible to separate the carrier or it is necessary to provide a special treatment as, for example, the use of an aqueous medium in U.S. Pat. No. 3,886,022.

A composite foil of the invention has little or no variability in the bond strength between the aluminum carrier layer and the ultra-thin copper foil. The bond strength is consistent both across individual composite foils and among multiple examples of the composite foil.

In producing a composite foil of the invention, the protective layer is formed on the aluminum carrier layer and, thereafter, an ultra-thin copper layer is deposited on the protective layer. Pretreatment of the aluminum carrier layer is desirable in order to clean it and to remove aluminum oxide, thus providing a clean surface for deposition of the protective layer. Since the bond strength should be uniform if the carrier is to be easily separated from the ultra-thin copper foil, this pretreatment helps to assure consistent results. Typically, a caustic bath is used for pretreatment of the aluminum carrier. In the Examples below, an aqueous bath containing sodium hydroxide, potassium sodium tartrate tetrahydrate, and sodium carbonate is used. The aluminum is dipped in the bath and then rinsed in deionized water before electrodepositing the protective layer of porous copper and interpenetrating zinc.

After preparing the surface of the aluminum carrier, a porous layer of copper is electrodeposited. The porous copper layer may be deposited from a copper pyrophosphate bath, as in the Examples, although it is believed that using a copper sulfate or other bath suitable for electrodepositing copper could be used. As will be seen in the Examples, the copper layer can be either too thick or too thin. It is considered to be sufficiently porous so that zinc can penetrate through it. The resulting zinc-containing layer has the needed bond strength. It has been found that a layer of copper of about 500–4000 $mg/m^2$ of aluminum is suitable, preferably about 500–3000 $mg/m^2$, as will be seen in the Table below. If the amount of copper deposited is less, the bond strength is too strong. If the amount of copper is greater, the bond strength is too low. The zinc is preferably electrodeposited, with about 15–150 $mg/m^2$ of aluminum found to give suitable bond strength, preferably about 50–100 $mg/m^2$.

The protective layer consists of a small amount of zinc relative to the amount of copper. Even so, the aluminum carrier surface is only partially covered by the copper deposit, as is shown in FIG. 1. This should permit access of zinc to the surface of the aluminum carrier which might be expected to produce a non-uniform bond strength. The results shown in the Examples suggest that the zinc is not deposited directly on the aluminum, but is preferentially deposited on the copper and penetrates through it to the aluminum. Whether this is a correct conclusion or not, the effect on the bond strength between the aluminum carrier and the ultra-thin copper foil shown in the Examples is clear. It can be seen that the bond strength does not vary significantly with the amount of copper deposited. When the amount of copper is 1000 $mg/m^2$, a significant portion of the aluminum surface is still exposed (FIG. 1). Below this amount, the experimental results show that the bond strength is too strong. As the copper deposit becomes larger (FIG. 1), less of the aluminum is accessible until, at about 4000 $mg/m^2$, it is believed that the zinc can no longer penetrate the copper layer to the aluminum surface. When only copper contacts the aluminum surface, the bond strength is too low. When a relatively larger amount of zinc is deposited relative to the copper deposit, however, it is possible to produce excessive bond strength. The reason for such a result is not entirely clear, but it may be that too much zinc reaches the surface of the aluminum carrier, since zinc forms too great a bond strength with aluminum.

The ultra-thin copper foil preferably is electrodeposited on top of the protective layer which has been placed on the aluminum carrier. Preferably, two methods of electrodepositing copper are used. A copper pyrophosphate bath gives a more uniform electrodeposition of copper. More importantly, it does not tend to dissolve the zinc, which would occur if an acidic copper sulfate bath were to be used. Copper pyrophosphate plating is preferred since it has advantages with respect to the environment and safety of operations, but a copper cyanide bath may also be used. Copper sulfate plating baths are advantageous if one considers productivity and cost. Thus, it is preferred that a first copper plating step providing a thickness sufficient to cover the zinc, typically at least 3000 $mg/m^2$, is done in a copper pyrophosphate bath, followed by a second plating step using a copper sulfate plating bath to provide the desired thickness of the ultra-thin copper foil. This method is used in the Examples below.

The conditions for copper pyrophosphate plating are not believed to be critical. It is preferred, however, that the copper concentration in the copper pyrophosphate plating bath be about 10–50 g/L and the potassium pyrophosphate about 100–700 g/L. The pH of the electrolytic solution preferably should be about 7–12. The bath temperature should be about 30–60° C., and the current density about 1–10 $A/dm^2$.

The conditions for acidic copper sulfate plating are also not considered critical. It is preferred, however, that the copper concentration in the copper sulfate plating bath be about 30–100 g/L, and that the sulfuric acid be about 50–200 g/L. The bath temperature of electrolytic solution preferably is about 30–80° C. and the current density about 10–100 $A/dm^2$.

The conditions for zinc plating are not considered to be critical. It is preferred, however, that the zinc concentration be about 1–10 g/l as zinc pyrophosphate and potassium pyrophosphate be present at about 50–500 g/L. The bath temperature is preferably about 20–60° C., and the current density is about 0.1–5 $A/dm^2$.

In order to enhance adhesion of the exposed surface of the ultra-thin copper foil to an insulating substrate, a peel enhancing treatment may be placed on the ultrathin copper foil layer by conventional methods, such as forming a nodular copper deposit on the surface of the foil by adjusting plating conditions. An example of a nodularization process may be found in U.S. Pat. No. 3,674,656. After the peel enhancing treatment is complete, a conventional passivation treatment may be added to the surface of the ultra-thin copper foil, such as by depositing zinc, zinc chromate, nickel, tin, cobalt and chromium on the nodularized ultra-thin copper layer. An example of such methods may be found in U.S. Pat. No. 3,625,844.

The surface of the treated ultra-thin copper foil produced by the methods just described will be laminated to an insulating substrate using heat and pressure to obtain a copper-clad laminate. As the insulating substrate, any of the resin substrates which are used to make circuit boards for electronic equipment can be used. Such resin substrates may include FR-4 (glass-fiber-epoxy), paper-phenolic, paper-epoxy, polyimides and the like. The aluminum carrier layer is then separated, leaving a copper-clad laminate consisting of the ultra-thin copper foil with its protective layer exposed and the insulating substrate. A printed wiring board is made by forming wiring patterns from the exposed ultra-thin copper layer.

The present invention will be described in further detail with reference to Examples below.

EXAMPLE 1

As an aluminum carrier layer, an aluminum foil having a thickness of 40 μm was chosen. The foil was pretreated, and then a porous layer of copper was electrodeposited, followed by electroplating with zinc. Then, the aluminum covered with the protective layer of copper and zinc was given a first copper plating step and a second copper plating step using the following procedures.

A. Pretreatment Of The Aluminum Carrier

The 40 µm aluminum foil was dipped into an aqueous solution containing 30 g/L of NaOH, 46 g/L of potassium sodium tartrate tetrahydrate, and 46 g/L of sodium carbonate at 40° C. for 27 seconds, removed, and rinsed in deionized water for 10 seconds to prepare the aluminum surface for electrodeposition of the protective layer.

B. Depositing A Porous Copper Layer

The pretreated aluminum carrier foil was placed in an aqueous copper pyrophosphate bath having a pH of 8.5 and containing 55.89 g/L copper pyrophosphate and 290 g/L of potassium pyrophosphate at a temperature of 50° C. A current density of 2.7 A/dm$^2$ was used. Copper was plated on the aluminum for a time sufficient to deposit the desired amount of copper, as shown in the Table below.

C. Depositing Zinc On The Porous Copper Layer

The aluminum foil containing the desired amount of copper was placed in a zinc pyrophosphate bath at 40° C. and a pH of 10.5 to deposit the desired amount of zinc. The bath contained 14 g/L of zinc pyrophosphate and 100 g/L of potassium pyrophosphate.

D. First Copper Plating Step

A cathodic electroplating treatment was carried out with a current density of 2.7 A/dm$^2$ by using a copper pyrophosphate plating bath, with a bath temperature of 50° C. and a pH of 8.5. The bath contained 55.89 g/L of copper pyrophosphate and 290 g/L of potassium pyrophosphate. A copper deposit of about 3000 mg/m$^2$ having a thickness of 0.3 µm was deposited on the protective release layer.

E. Second Copper Plating Step

The surface of the initial copper deposit was rinsed in deionized water and then electroplated at a current density of 10 A/dm$^2$ using a copper sulfate plating bath at a temperature of 40° C., and containing 216 g/L of copper sulfate pentahydrate and 150 g/L sulfuric acid, to deposit about 5 µm thickness of copper.

Figure 2:
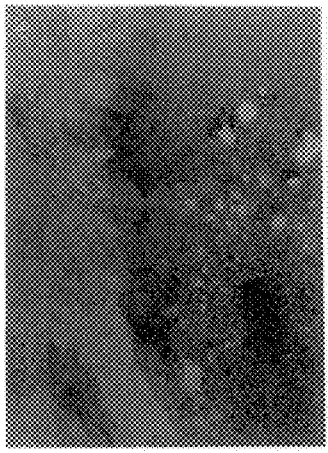
FIG. 2 is a series of photographs illustrating the discoloration of copper foil to reported in the Table.

The composite foil was laminated on four sheets of FR-4, and then hot pressed under a pressure of 25 kg/cm$^2$ at 175° C. for 60 minutes to obtain a copper-clad laminate. The strength of the bond between the ultra-thin copper foil and the 45 µm aluminum carrier layer was measured in accordance with JIS-C-6481 before and after lamination. The discoloration of the exposed copper surface after separation was also determined and given a rating shown in the Table below. The ratings are illustrated by the photographs of FIG. 2.

The following general conclusions may be drawn from the results of Example 1. First, since the two layers of copper which make up the ultra-thin copper foil were the same in each instance, the relative size of the porous copper and zinc deposits (the protective layer) was the principal reason for the bond strength and surface discoloration which was measured. It appears that increasing the amount of zinc present produces the least discoloration. This indicates that zinc is penetrating the copper deposit to reach the aluminum-copper interface. It is preferred that at least 50 mg of zinc for each m$^2$ of aluminum is used. The ratio of copper to zinc does not appear to have a significant effect on the bond strength after lamination, which is an unexpected observation. It appears, however, that there is a maximum amount of zinc which can be deposited, even when the copper deposit is relatively heavy. Note the relatively high bond strength when the porous copper is 3700 mg/m$^2$ and the zinc is 145 mg/m$^2$. That result is consistent with those shown in Comparative Example 4. It is concluded that suitable bond strengths are obtained between about 500–4000 mg of copper per m$^2$ of aluminum surface. The amount of zinc may be from about 15–150 mg per m$^2$ of aluminum surface, but about 50–100 mg per m$^2$ is preferred.

COMPARATIVE EXAMPLE 1

A composite foil was made in the same manner as in Example 1, except that only the porous copper was deposited and deposition of zinc and the first thin copper layer was omitted. The results are shown in the Table below. The bond strength was too low before lamination and negligible after lamination. The surface discoloration rating was poor.

Thus, it may be concluded that a zinc deposit is necessary to provide the needed bond strength and to protect the copper surface.

COMPARATIVE EXAMPLE 2

A composite foil was made in the same manner as in Example 1, except that the porous copper layer was omitted and the zinc was deposited by the zincate replacement reaction. The results are shown in the Table below. The aluminum foil carrier could not be separated, either before or after lamination.

When the zincate treatment was replaced by electrodeposition of zinc, the bond strength was undesirably high before lamination and the aluminum foil could not be separated after lamination.

Thus, it may be concluded that in the absence of porous copper, the bond strength is too high to permit separation of the aluminum carrier foil from the ultra-thin copper.

COMPARATIVE EXAMPLE 3

A composite foil was made as in Example 1, except that the porous copper deposit was too heavy. As shown in the Table below, the bond strength was too low, both before and after lamination.

Thus, it may be concluded that if the amount of copper deposited hinders penetration of zinc, zinc access is insufficient to provide the needed bond strength.

COMPARATIVE EXAMPLE 4

Three composite foils were prepared according to Example 1, except that the amount of zinc deposited was greater than had been shown to be satisfactory in Example 1 or the zinc was supplied by the zincate treatment. In each case, the aluminum foil could not be separated from the ultra-thin copper foil after lamination.

It may be concluded that the relative amounts of porous copper and zinc are related. Neither can be too large if the desired bond strength is to be achieved.

COMPARATIVE EXAMPLE 5

Two composite foils were prepared according to Example 1, except that the first layer of ultra-thin copper was omitted. Only a copper sulfate bath was used to deposit the ultra-thin foil. As the results in the Table show, the bond strength was undesirably low.

It may be concluded that the zinc had been removed by the acid bath, leaving mainly the lightly bound porous copper layer against the aluminum foil.

TABLE

Evaluation After Hot Press Bonding With Variation Of The Processing Steps

| | Amount Of Electrodeposited Metal After Pretreatment Of Aluminum Foil | | | | UTC Foils Performance | | |
|---|---|---|---|---|---|---|---|
| | | | | | At Room Temperature | After Hot Press Bonding | |
| | Porous Copper (mg/m$^2$) | Zinc (mg/m$^2$) | First Layer Copper (mg/m$^2$) | Second Layer Copper | Bond Strength (gf/cm) | Bond Strength (gf/cm) | Surface (1) Discoloration |
| Example 1 | 500 | 15 | 3000 | 5 μm | N/A | 4.8 | 2 |
| | 1000 | 15 | 3000 | 5 μm | N/A | 5.5 | 2 |
| | 1700 | 50 | 3000 | 5 μm | 3.8 | 4.3 | 3 |
| | 2400 | 126 | 3000 | 5 μm | N/A | 5.0 | 3 |
| | 3000 | 126 | 3000 | 5 μm | 3.0 | 5.0 | 3 |
| | 3700 | 80 | 3000 | 5 μm | N/A | 5.5 | 3 |
| | 3700 | 145 | 3000 | 5 μm | N/A | 16.1 | 3 |
| Comparative Example 1 | 3000 | None | None | 5 μm | 0.5 | 0.0 | 1 |
| Comparative Example 2 | — | Zincate | 3000 | 5 μm | Unpeelable | Unpeelable | * |
| | — | 120 | 3000 | 5 μm | 9.4 | Unpeelable | * |
| Comparative Example 3 | 4400 | 145 | 3000 | 5 μm | 0.5 | 0.0 | 1 |
| Comparative Example 4 | 1500 | 126 | 3000 | 5 μm | N/A | Unpeelable | * |
| | 3000 | 145 | 3000 | 5 μm | N/A | Unpeelable | * |
| | 3000 | Zincate | 3000 | 5 μm | N/A | Unpeelable | * |
| Comparative Example 5 | 3000 | 120 | None | 5 μm | 0.5 | 0.0 | 1 |
| | 3000 | 180 | None | 5 μm | 0.5 | 0.0 | 1 |

(1) 1 = 50–100% discolored
2 = 2–49% discolored
3 = <1% discolored
See FIG. 2

What is claimed is:

1. A composite foil comprising a protective layer disposed between an aluminum carrier layer and an ultra-thin copper foil wherein the protective layer comprises a porous layer of copper with interpenetrating zinc sufficient to provide suitable bond strength between the aluminum carrier layer and the ultra-thin copper foil and to protect said ultra-thin copper foil after the aluminum carrier layer has been separated.

2. A composite foil of claim 1, wherein said protective layer comprises a porous layer of about 500–4000 mg of electrodeposited copper for each m$^2$ of said aluminum carrier layer and about 15–150 mg of electrodeposited zinc for each m$^2$ of said aluminum carrier layer.

3. A composite foil of claim 2, wherein said porous layer of electrodeposited copper comprises about 500–3000 mg of copper for each m$^2$ of said aluminum carrier layer and said electrodeposited zinc comprises about 50–100 mg of zinc for each m$^2$ of said aluminum carrier layer.

4. A composite foil of claim 1, wherein the bond strength between said ultra-thin copper foil and said aluminum carrier layer is about 1–50 gf/cm.

5. A composite foil of claim 1, wherein the thickness of said ultra-thin copper foil is less than 12 μm.

6. A composite foil of claim 1, wherein said aluminum carrier layer has a thickness up to about 5 mm.

7. A composite foil of claim 6, wherein said aluminum carrier layer has a thickness of about 18–70 μm.

8. A composite foil of claim 1, wherein said ultra-thin copper foil further comprises a nodularization treatment on the exposed copper surface thereof to enhance the peel strength between the exposed surface of the ultra-thin copper foil and a substrate.

9. A composite foil of claim 8, wherein said ultra-thin copper foil further comprises a passivation treatment on the exposed surface thereof to prevent oxidation of the exposed surface of the ultra-thin copper foil.

10. A composite foil of claim 9, wherein said passivation treatment comprises depositing at least one member of the group consisting of zinc, zinc chromate, nickel, tin, cobalt, and chromium to said nodularized ultra-thin copper layer.

11. A copper-clad laminate comprising a composite foil of claim 1 laminated to a substrate.

12. A copper-clad laminate of claim 10, wherein the aluminum carrier layer has been removed to expose said ultra-thin copper foil.

13. A printed wiring board comprising the copper-clad laminate of claim 12.

14. A multi-layer printing wiring board formed by laminating on at least one side of an inner layer board on which wiring patterns were previously formed a composite foil according to claim 1 to obtain a copper clad laminate, separating the aluminum carrier layer from the copper clad laminate to expose the ultra-thin copper foil, and forming a wiring pattern from said ultra-thin copper foil, thereby obtaining a multilayer printed wiring board.

15. A multi-layer printed wiring board formed by laminating a plurality of printed wiring boards according to claim 14.

16. A process for producing a composite foil comprising an ultra-thin copper foil on an aluminum carrier layer comprising:
(a) cleaning and removing aluminum oxide from the surface of said aluminum carrier layer;
(b) electrodepositing a protective layer on said aluminum carrier layer, said protective layer comprising a porous copper layer on said aluminum carrier layer and an interpenetrating zinc layer on the porous copper layer;
(c) electrodepositing a first layer of copper from a bath which does not remove said zinc layer of (b);
(d) electrodepositing on the first layer of copper of (c) sufficient copper to provide the desired ultra-thin copper foil.

17. A process of claim 16, wherein said porous layer of copper of (b) is about 500–4000 mg of copper for each m$^2$ of said aluminum carrier layer and said zinc layer is about 15–150 mg of zinc for each m$^2$ of said aluminum carrier layer.

18. A process of claim 17, wherein said porous layer of copper of (b) is about 50–3000 mg of copper for each m² of said aluminum carrier layer and said zinc layer is about 50–100 mg of zinc for each m² of said aluminum carrier layer.

19. A process of claim 16, wherein said electrodeposition of (c) employs an electrolytic bath which is substantially free of acid.

20. A process of claim 19, wherein said electrolytic bath is a copper cyanide or copper pyrophosphate bath.

21. A process of claim 19, wherein said electrodeposition of (c) is used to deposit at least 3000 mg/m² of copper on said zinc of (c).

22. A process of claim 16, wherein said electrodeposition of (c) employs a first electrolytic bath containing copper pyrophosphate to deposit a first layer of copper, followed by said electrodeposition of (d) using a second electrolytic bath containing copper sulfate and sulfuric acid to deposit a second layer of copper on said first layer.

23. A process of claim 22, wherein said first layer is at least 0.3 µm thick and the thickness of said first and second layers is up to about 12 µm.

24. A process of claim 16, further comprising the step of applying to said ultra-thin copper layer a nodularizing treatment to improve adhesion of the exposed surface of said ultra-thin copper layer to a substrate.

25. A process of claim 24, further comprising the step of applying a passivation treatment to said nodularized ultra-thin copper layer to prevent oxidation of said ultra-thin copper layer.

26. A process of claim 25, wherein said passivation treatment comprises depositing at least one member of the group consisting of zinc, zinc chromate, nickel, tin, cobalt and chromium to said nodularized ultra-thin copper layer.

* * * * *